(12) United States Patent
Mahalingam et al.

(10) Patent No.: US 7,932,535 B2
(45) Date of Patent: Apr. 26, 2011

(54) SYNTHETIC JET COOLING SYSTEM FOR LED MODULE

(75) Inventors: Raghavendran Mahalingam, Decatur, GA (US); Samuel Heffington, Austin, TX (US)

(73) Assignee: Nuventix, Inc., Austin, TX (US)

( * ) Notice: Subject to any disclaimer, the term of this patent is extended or adjusted under 35 U.S.C. 154(b) by 0 days.

(21) Appl. No.: 11/265,778

(22) Filed: Nov. 2, 2005

(65) Prior Publication Data

US 2007/0096118 A1 May 3, 2007

(51) Int. Cl.
*H01L 33/00* (2010.01)
*H01L 23/34* (2006.01)

(52) U.S. Cl. ............... 257/99; 257/713; 257/E23.093

(58) Field of Classification Search ............ 257/99, 257/100, 433, 721, 722, 81, 712, 713, E33.075, 257/E31.131, E23.051, E23.08, E23.093, 257/E23.087, E23.099, E23.1, 79, E23.097, 257/E23.075
See application file for complete search history.

(56) References Cited

U.S. PATENT DOCUMENTS

| | | |
|---|---|---|
| 3,464,672 A | 9/1969 | Massa |
| 4,031,171 A | 6/1977 | Asao et al. |
| 4,238,425 A | 12/1980 | Matsuoka et al. |
| 4,257,224 A | 3/1981 | Wygnanski et al. |
| 4,406,323 A | 9/1983 | Edelman |
| 4,490,649 A | 12/1984 | Wang |
| 4,498,851 A | 2/1985 | Kolm et al. |
| 4,501,319 A | 2/1985 | Edelman et al. |
| 4,503,358 A | 3/1985 | Kamei et al. |
| 4,590,399 A | 5/1986 | Roxio et al. |
| 4,590,970 A | 5/1986 | Mott |
| 4,595,338 A | 6/1986 | Kolm et al. |
| 4,630,182 A | 12/1986 | Moroi et al. |
| 4,664,345 A | 5/1987 | Lurz |
| 4,667,877 A | 5/1987 | Yao et al. |
| 4,697,116 A | 9/1987 | Nakamura et al. |
| 4,697,769 A | 10/1987 | Blackwelder et al. |
| 4,708,600 A | 11/1987 | AbuJudom, II et al. |
| 4,763,225 A | 8/1988 | Frenkel et al. |
| 4,780,062 A | 10/1988 | Yamada et al. |
| 4,802,642 A | 2/1989 | Mangiarotty |
| 4,923,000 A | 5/1990 | Nelson |

(Continued)

FOREIGN PATENT DOCUMENTS

EP 0 385 090 1/1990

OTHER PUBLICATIONS

Mahalingam et al. "Air cooled Heat sinks Integrated with Synthetic Jets, 2002 Inter Society Conference on Thermal Phenomena" 2002 Iner Society Conference on Thermal Phenomena, pp. 285-291.*

(Continued)

*Primary Examiner* — Matthew S. Smith
*Assistant Examiner* — Sarah K Salerno
(74) *Attorney, Agent, or Firm* — Fortkort & Houston P.C.; John A. Fortkort

(57) ABSTRACT

An LED assembly is provided herein. The assembly comprises a thermally conductive housing (201), wherein a portion of said housing is equipped with a plurality of fins (203); an LED (205) disposed in said housing; and a synthetic jet actuator (207) adapted to direct a synthetic jet onto said portion of the housing.

58 Claims, 16 Drawing Sheets

U.S. PATENT DOCUMENTS

| | | | |
|---|---|---|---|
| 4,930,701 A | 6/1990 | Porter et al. | |
| 4,932,610 A | 6/1990 | Maestrello | |
| 4,938,742 A | 7/1990 | Smits | |
| 4,939,405 A | 7/1990 | Okuyama et al. | |
| 4,941,398 A | 7/1990 | Morris et al. | |
| 4,969,802 A | 11/1990 | Merrigan et al. | |
| 4,976,311 A | 12/1990 | Kurzweg | |
| 4,989,810 A | 2/1991 | Meier et al. | |
| 5,008,582 A | 4/1991 | Tanuma et al. | |
| 5,083,194 A * | 1/1992 | Bartilson | 257/722 |
| 5,089,862 A | 2/1992 | Warner, Jr. et al. | |
| 5,130,912 A | 7/1992 | Friederichs et al. | |
| 5,136,489 A | 8/1992 | Cheng et al. | |
| 5,190,099 A | 3/1993 | Mon | |
| 5,209,438 A | 5/1993 | Wygnanski | |
| 5,335,143 A | 8/1994 | Maling, Jr. et al. | |
| 5,346,745 A | 9/1994 | Bandyopadhyay | |
| 5,361,989 A | 11/1994 | Merchat et al. | |
| 5,395,592 A | 3/1995 | Bolleman et al. | |
| 5,402,312 A | 3/1995 | Kinjo et al. | |
| 5,411,208 A | 5/1995 | Burgener | |
| 5,419,780 A | 5/1995 | Suski | |
| 5,429,302 A | 7/1995 | Abbott | |
| 5,437,421 A | 8/1995 | Nosenchuck et al. | |
| 5,493,615 A | 2/1996 | Burke et al. | |
| 5,595,205 A | 1/1997 | Sirovich et al. | |
| 5,681,152 A | 10/1997 | Anghs | |
| 5,758,823 A | 6/1998 | Glezer et al. | |
| 5,785,418 A | 7/1998 | Hochstein | |
| 5,791,601 A | 8/1998 | Dancila et al. | |
| 5,797,414 A | 8/1998 | Sirovich et al. | |
| 5,798,465 A | 8/1998 | Ziada et al. | |
| 5,861,703 A | 1/1999 | Losinski | |
| 5,876,187 A | 3/1999 | Afromowitz et al. | |
| 5,881,954 A | 3/1999 | Holm | |
| 5,901,034 A * | 5/1999 | Fuglister | 361/641 |
| 5,901,037 A | 5/1999 | Hamilton et al. | |
| 5,921,757 A | 7/1999 | Tsutsui et al. | |
| 5,983,944 A | 11/1999 | Niv | |
| 5,996,903 A | 12/1999 | Asai et al. | |
| 6,008,126 A | 12/1999 | Leedy | |
| 6,020,257 A | 2/2000 | Leedy | |
| 6,045,240 A | 4/2000 | Hochstein | |
| 6,123,145 A | 9/2000 | Glezer et al. | |
| 6,186,748 B1 | 2/2001 | Umeda | |
| 6,280,148 B1 | 8/2001 | Zengerle et al. | |
| 6,318,886 B1 | 11/2001 | Stopa et al. | |
| 6,333,852 B1 | 12/2001 | Lin | |
| 6,353,295 B1 | 3/2002 | Sridhar et al. | |
| 6,440,212 B1 | 8/2002 | Hayes | |
| 6,451,175 B1 | 9/2002 | Lal | |
| 6,457,654 B1 | 10/2002 | Glezer et al. | |
| 6,481,984 B1 | 11/2002 | Shinohara et al. | |
| 6,511,209 B1 | 1/2003 | Chiang | |
| 6,517,221 B1 | 2/2003 | Xie | |
| 6,541,800 B2 | 4/2003 | Barnett et al. | |
| 6,554,607 B1 | 4/2003 | Glezer et al. | |
| 6,588,497 B1 * | 7/2003 | Glezer et al. | 165/84 |
| 6,628,522 B2 | 9/2003 | Trautman et al. | |
| 6,770,960 B2 | 8/2004 | Oohata | |
| 6,809,928 B2 | 10/2004 | Gwin et al. | |
| 6,848,631 B2 | 2/2005 | Monson et al. | |
| 2001/0030866 A1 | 10/2001 | Hochstein | |
| 2002/0098097 A1 | 7/2002 | Singh et al. | |
| 2003/0075615 A1 | 4/2003 | Saddoughi | |
| 2003/0076033 A1 * | 4/2003 | Wu | 313/512 |
| 2003/0151895 A1 | 8/2003 | Zou | |
| 2003/0177899 A1 * | 9/2003 | Monson et al. | 92/98 R |
| 2004/0120148 A1 | 6/2004 | Morris et al. | |
| 2004/0190305 A1 * | 9/2004 | Arik et al. | 362/555 |
| 2005/0046801 A1 * | 3/2005 | Yamada | 353/54 |
| 2005/0111185 A1 | 5/2005 | Bhattacharya et al. | |
| 2005/0247947 A1 * | 11/2005 | Owen et al. | 257/89 |

OTHER PUBLICATIONS

Fitch, John S.; A One-Dimensional Thermal Model for the VAX 9000 Multi Chip Units; WRL Research Report 90/6; 27 pages; Jul. 1990.

Mahalingam, R.; "An Actively Cooled Heat Sink Integrated With Synthetic Jets"; Proceedings of NHTC 2001; 6 pages; Jun. 10-12, 2001, Anaheim, CA.

OPTO Semiconductors; "Thermal Management of SMT LED" white paper; 8 pages; Aug. 7, 2002.

Heffington, S.; "Enhanced Boiling Heat Transfer by Submerged, Vibration Induced Jets"; 6 pages; Therminic; Aix-en-Provence, France, Sep. 24-26, 2003.

Heffington, S.; "Enhanced Boiling Heat Transfer by Submerged Ultrasonic Vibrations"; 5 pages; Therminic; Sophia Antipolis, Cote d'Azur, France; Sep. 29-Oct. 1, 2004.

LUMILEDS, "Luxeon for Flashlight Applications"; Reference Design DR02; 2005.

DiLouie, C.; "LED Drivers: The Power Behind LEDs" white paper; Lighting Control Association; 3 pages; Sep. 2005.

* cited by examiner

SYNTHETIC JET COOLING SYSTEM FOR LED MODULE

FIELD OF THE DISCLOSURE

The present disclosure relates generally to synthetic jet actuators, and more specifically to the use of synthetic jet actuators to cool LED modules.

BACKGROUND OF THE DISCLOSURE

Light-emitting diodes (LEDs) have become ubiquitous in the electronics world, where they are utilized as light sources in a wide variety of applications. Some specific examples include the use of LEDs as indicators and in electronic displays. More recently, the use of LEDs has expanded to such products as traffic control systems, street lighting, spot lighting for home and industrial applications and automobile headlights.

FIG. 1 illustrates a typical diode 111 of the type used in an LED module. The diode 111, which may comprise a semiconductor material such as AlGaAs, has a P-type region 113 and an N-type region 115 defined thereon. The P-type region 113 and the N-type region 115 are equipped with electrodes 117 and 119, respectively, and are separated by a junction 121 across which a depletion zone 123 exists. When the electrode 119 in contact with the N-type region 115 is positively charged (thereby serving as an anode) and the electrode 117 in contact with the P-type region 113 is negatively charged (thereby serving as a cathode), free electrons and holes accumulate on opposing sides of the diode, thus widening the depletion zone 123. This process causes free electrons moving across the diode 111 to fall into empty holes from the P-type region 113, with an associated drop in the energy of the electrons from a conduction band to a lower energy band. The energy released by this process is emitted as photons. Due to the particular band gap in AlGaAs and other semiconductor materials commonly used in LEDs, the frequencies of the emitted photons fall within the visible region of the spectrum. Hence, when suitably harnessed, this phenomenon can be used to create LED light sources.

FIG. 2 depicts a typical LED module which incorporates a diode of the type depicted in FIG. 1. As seen therein, the LED module 131 comprises a diode 133 to which is connected first 135 and second 137 terminals. The diode 131 is enclosed within a housing 139. The housing 139 is constructed such that light emitted from the diode 133 which impinges on the side 141 of the housing will be reflected, while light impinging on the top 143 of the housing 139 will be transmitted. Consequently, the diode 133 acts as a directional light source.

Due to their unique structure, LEDs have certain advantages over other known light sources such as fluorescent lamps, incandescent lamps and mercury lamps. In particular, LEDs do not utilize a filament. Hence, compared to filament-based light sources, illumination devices equipped with LEDs are more compact and, at least potentially, have much longer life spans.

At present, heat dissipation is one of the major obstacles currently facing commercial applications of LEDs, especially in applications that involve the use of LEDs as illumination sources. While LEDs have been demonstrated to have lifetimes of 50,000 hours or greater, their lifetimes drop off sharply with increases in operating temperature. Thus, in one study reported in the literature, lifetimes in LED modules were observed to drop more than 7-fold when the operating temperatures of the modules were raised from 25° C. to 90° C.

In a typical LED, a significant portion of the current that is applied to the electrodes is subsequently converted into thermal energy. In lighting applications, the amount of thermal energy generated is significant, due to the number of lumens that the LED module must generate. Consequently, in order to maintain the illumination source at an acceptable operating temperature and to thereby achieve an adequate lifetime for the system, such an illumination source must be equipped with an efficient heat dissipation system.

Some attempts have been made in the art to equip LED modules with thermal management systems. These approaches typically involve the installation of a heat sink on the back of a substrate to which the LED is mounted. The heat sink is then used in conjunction with a heat dissipation system such as a fan or a piezoelectric jet actuator. However, while this approach does dissipate some of the heat generated by the LED module, it also increases the size and/or footprint of the module. Consequently, this approach compromises the compactness of the LED module, which is one of the major advantages of LED light sources. Moreover, the use of fans or piezoelectric devices to cool the heat sink is undesirable in that these devices generate noise, while most lighting applications require silent operation. Furthermore, in many applications such as ceiling mounted lighting, spatial constraints dictate a low product profile. In such applications, the attachment of a heat sink to the back of the device provides no benefit, since there is no means for entraining cool air or for disposing heated air into the ambient environment.

There is thus a need in the art for a means for efficiently and quietly dissipating heat generated by an LED module, and for an LED module that incorporates such a means. There is further a need in the art for such an LED module that is compact and offers flexibility of positioning. These and other needs are met by the devices and methodologies described herein.

SUMMARY OF THE DISCLOSURE

In one aspect, an LED assembly is provided herein. The assembly comprises a housing, an LED disposed in said housing, and a synthetic jet actuator adapted to direct a synthetic jet onto, along, or through said housing or said LED.

In another aspect, an LED assembly is provided which comprises a thermally conductive housing, wherein a portion of said housing is equipped with a plurality of fins, and an LED is disposed in said housing. A synthetic jet actuator is provided which is adapted to direct a synthetic jet onto said portion of the housing.

In still another aspect, a light fixture is provided herein which comprises an elongated bulb having a first terminal portion comprising a first electrode and a second terminal portion comprising a second electrode, said bulb having a hot spot disposed along its length. A synthetic jet actuator is provided which is adapted to direct a synthetic jet towards said hot spot.

These and other aspects of the present disclosure are described in greater detail below.

DETAILED DESCRIPTION

It has now been found that the aforementioned needs can be addressed through the provision of an LED assembly equipped with one or more synthetic jet actuators that are adapted to directly cool the assembly, and in particular, the housing and/or diode thereof. Due to the high rate of heat dissipation offered by synthetic jet actuators, LED assemblies equipped with these devices can be maintained within lower operating temperature ranges, and hence experience longer lifetimes.

Figure 1:
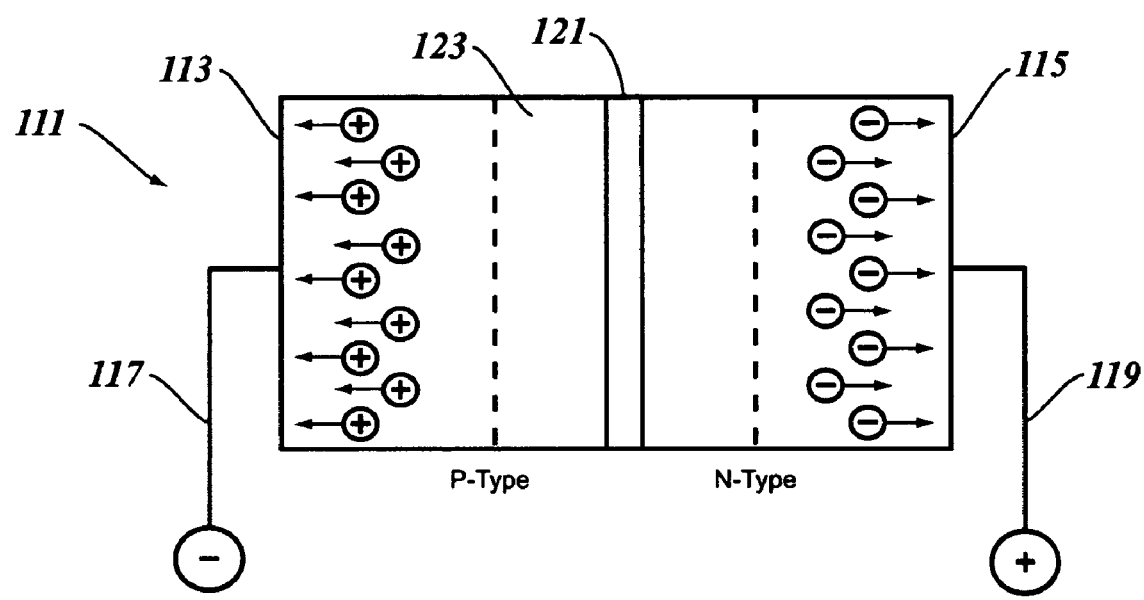
FIG. 1 is an illustration of a prior art diode useful in light-emitting diode (LED) applications.
Figure 2:
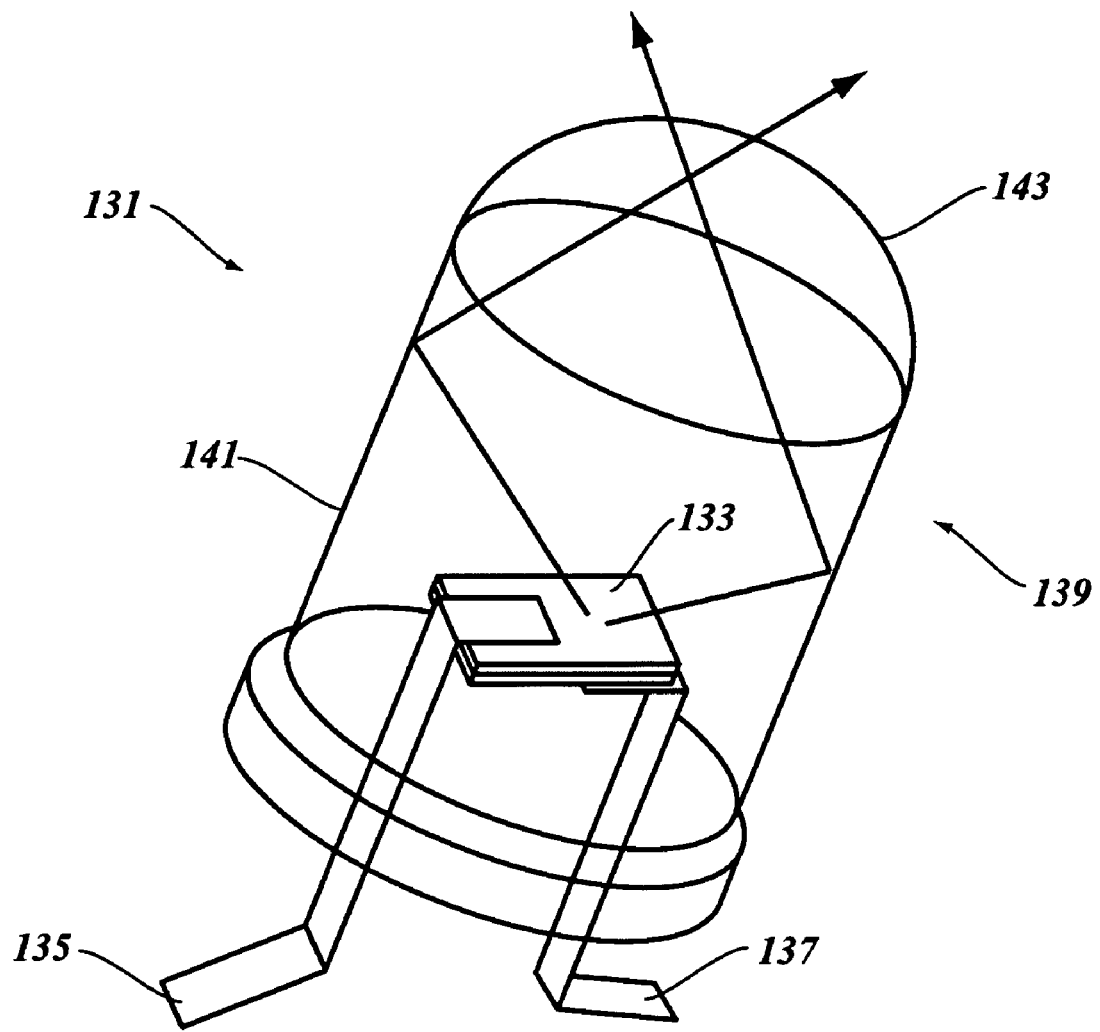
FIG. 2 is an illustration of a prior art light-emitting diode module.
Figure 3:
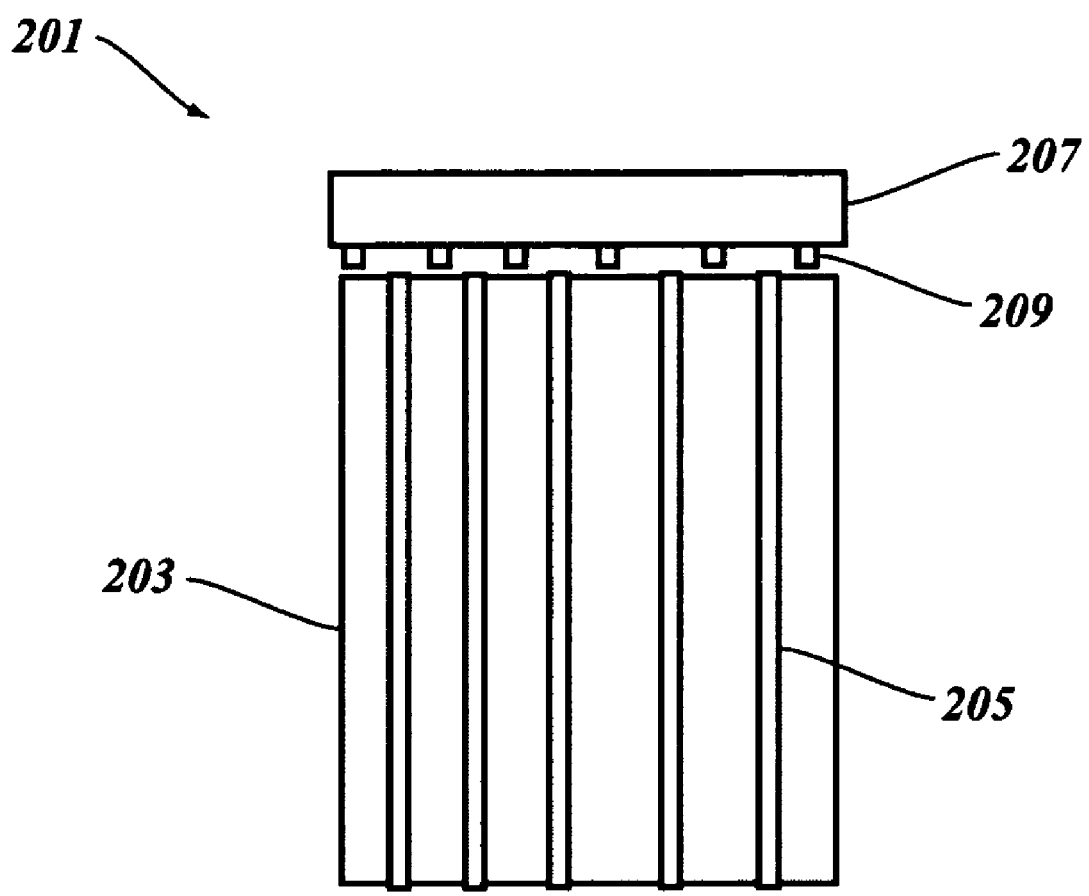
FIG. 3 is an illustration of an LED assembly in accordance with the teachings herein.

The devices and methodologies disclosed herein can be appreciated with reference to FIG. 3, which is an illustration of a first embodiment of an LED assembly made in accordance with the teachings herein. The LED assembly 201 comprises an LED housing 203 which preferably comprises a thermally conductive material such as aluminum, copper, or various metal alloys, and which is equipped with a plurality of fins 205. A synthetic jet actuator 207 is disposed on said LED housing 203 and is equipped with a plurality of nozzles 209 that are adapted to direct synthetic jets into the channels formed by adjacent fins 205. For clarity of illustration, the LED assembly 201 is shown with the synthetic jet actuator 207 being separated from the LED housing 203 by a gap, although in actual embodiments, such a gap may or may not exist.

Figure 4:
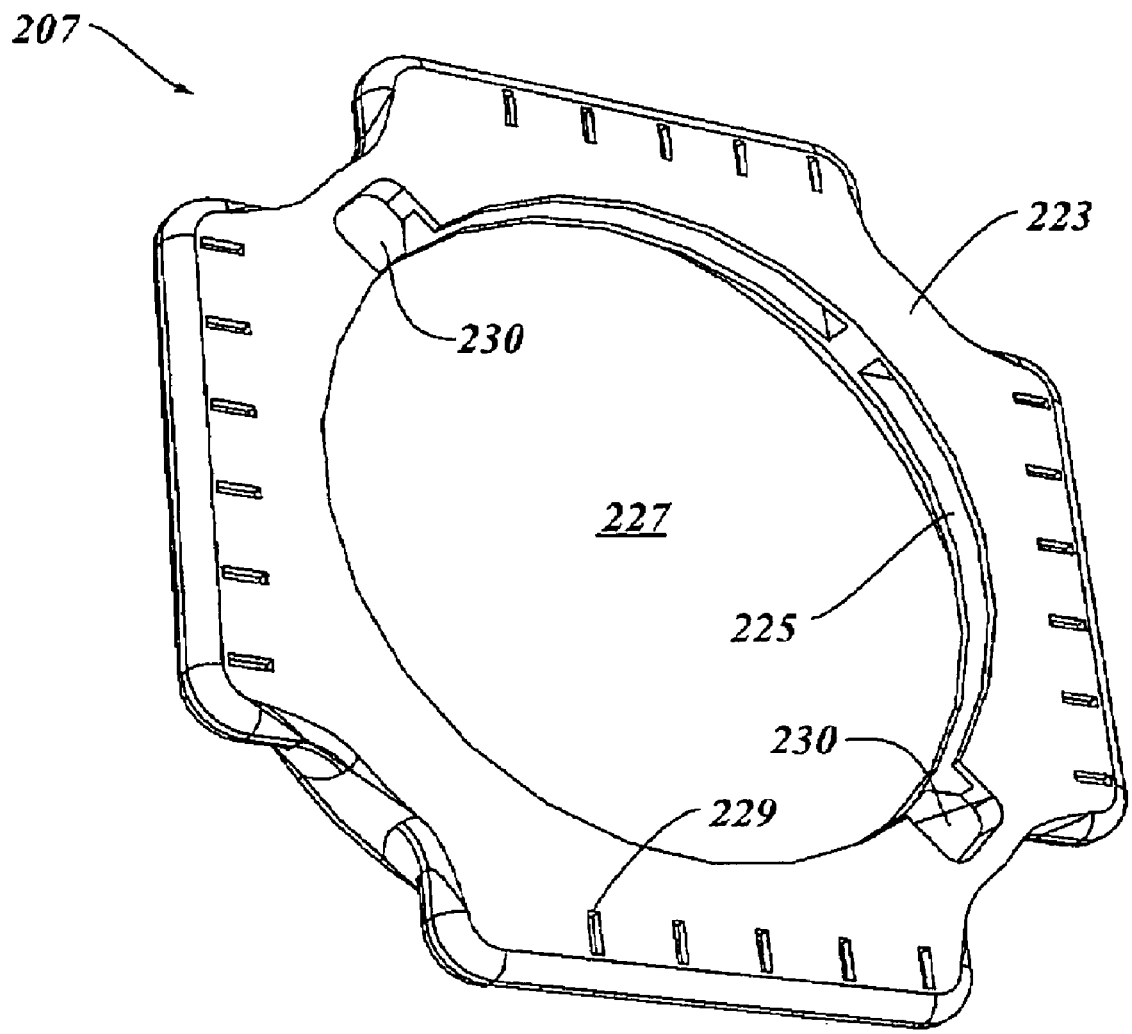
FIG. 4 is an illustration showing the bottom of one embodiment of an LED housing member equipped with a plurality of synthetic jet actuators that can be used to cool the LED in accordance with the teachings herein.
Figure 5:
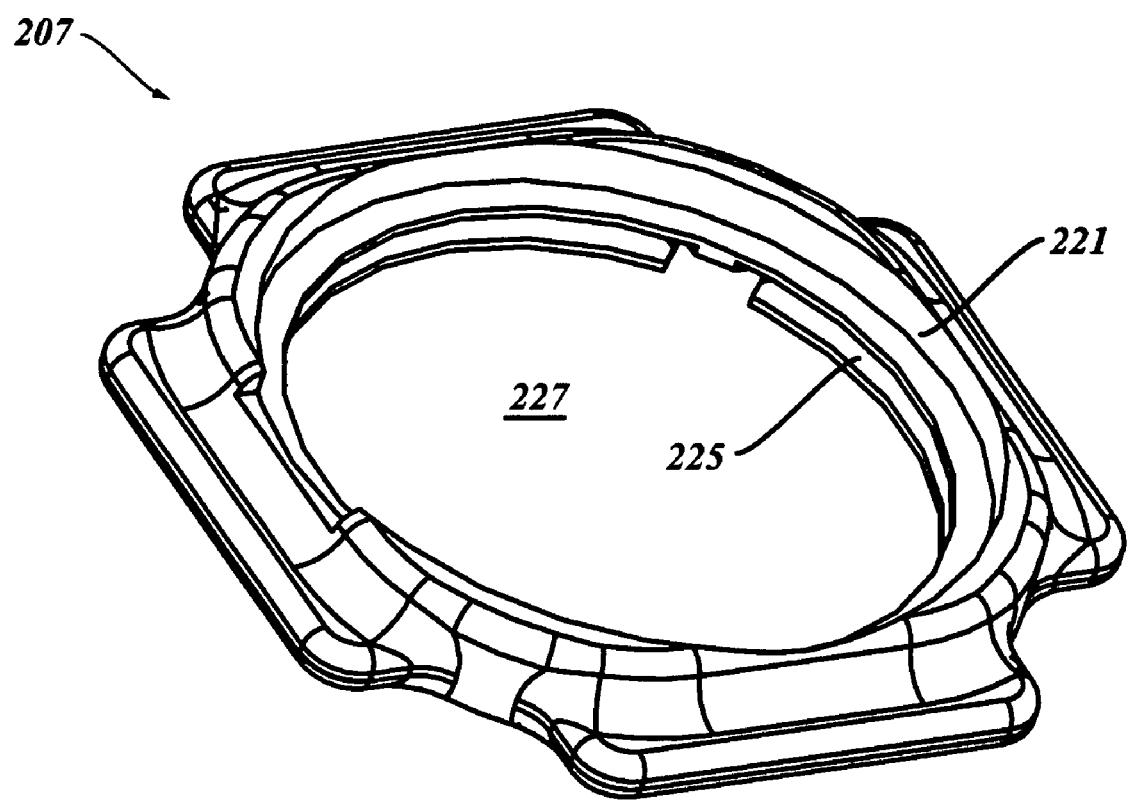
FIG. 5 is an illustration showing the top view of the LED housing member of FIG. 4.

The details of the synthetic jet actuator 207 of FIG. 3 may be appreciated in greater detail with reference to the particular embodiment depicted in FIGS. 4-5. As seen therein, in this particular embodiment, the actuator 207 comprises a top member 221 (see FIG. 5) and a bottom member 223 (see FIG. 4) that enclose an interior space 225. The actuator 207 is equipped with a central opening 227 in which a diaphragm is seated (the diaphragm has been removed for ease of illustration). The bottom member 223 is equipped with a plurality of nozzles 229 or apertures that are arranged around the periphery of the device in four discrete sets and that are driven by the diaphragm. In use, the diaphragm is made to vibrate at a suitable frequency so as to induce the formation of synthetic jets at the nozzles. The actuator 207 may be used in conjunction with a heat sink having an annular housing, wherein the actuator 207 is adapted to releasably attach to one end of the housing. In such embodiments, the housing may be equipped with at least one tab that rotatably engages an aperture 230 provided in the actuator 207.

Figure 6:
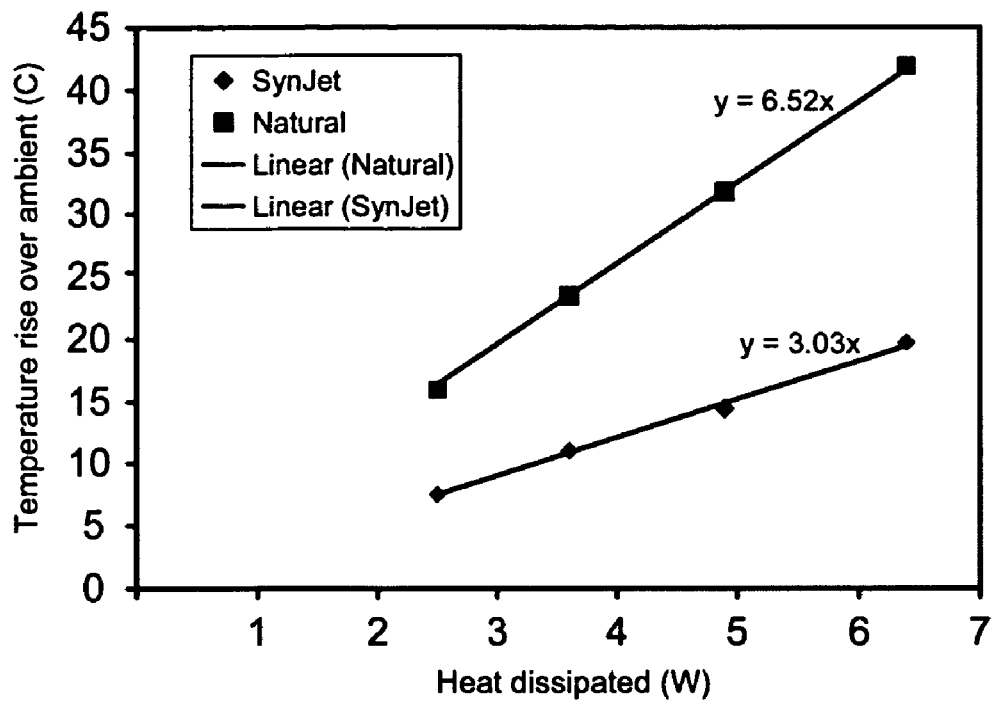
FIG. 6 is a graph of the temperature rise over ambient temperature (in ° C.) as a function of the quantity of heat dissipated (in W)

The effectiveness of the systems described herein in cooling an LED assembly may be appreciated with reference to FIG. 6. The graph shown therein illustrates the temperature rise (over ambient temperature) as a function of the quantity of heat to be dissipated. The data points denoted "SynJet" correspond to data obtained for an LED assembly of the type depicted in FIG. 3 which is equipped with synthetic jet actuators, while the data points denoted "Natural" correspond to the analogous system which is devoid of synthetic jet actuators.

As seen in FIG. 6, the temperature rise of the LED system as a function of the quantity of heat to be dissipated is essentially linear for both systems. However, the slope of the curve corresponding to the "SynJet" system is less than half of the slope of the curve for the "Natural" system (about 3.0 as compared to about 6.5). Hence, it can be seen that the LED assembly equipped with synthetic jet actuators provides a rate of heat dissipation that is about 2.2 times that of the comparative system that is not equipped with synthetic jet actuators.

Figure 7:
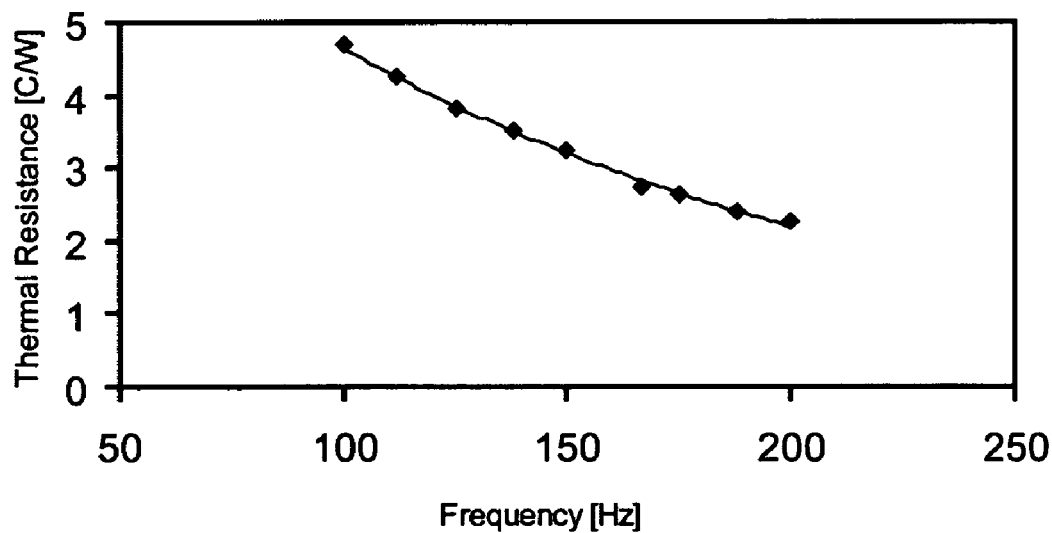
FIG. 7 is a graph of thermal resistance (in ° C./W) as a function of frequency.

FIG. 7 illustrates the effect that the operating frequency of the synthetic jet actuator (that is, the frequency at which the diaphragm of the synthetic jet actuator vibrates) has on the ability of the device to dissipate heat. As seen therein, as operating frequency increases, thermal resistance decreases, and hence heat dissipation increases. The relationship between operating frequency and thermal resistance is not linear, and hence, the incremental gain in heat dissipation per unit operating frequency begins to decrease as the operating frequency increases.

Without wishing to be bound by theory, it is believed that increases in operating frequency increase the mass flow rate of ambient fluid around the heat generating surfaces, thus improving heat dissipation. However, a point of diminishing returns is reached, due in part to the decreasing ability of further increases in operating frequency to increase mass flow rate. Hence, these results suggest that, within certain ranges, the operating frequency may be tailored to the heat load.

Figure 8:
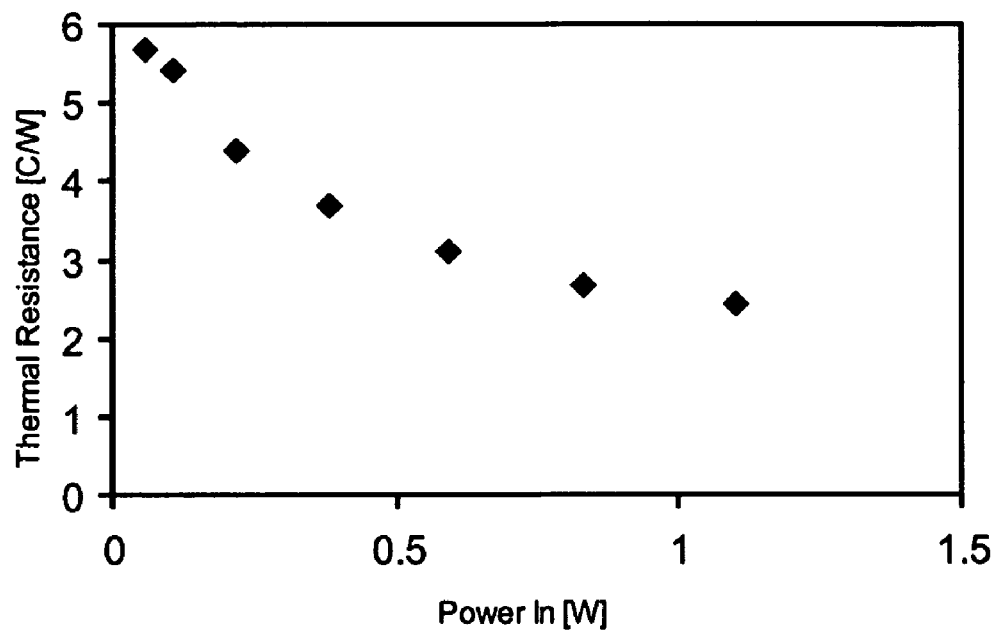
FIG. 8 is a graph of thermal resistance (in ° C./W) as a function of power (in W)

FIG. 8 is a graph of thermal resistance as a function of input (actuator) power for an LED assembly of the type depicted in FIG. 3. As seen therein, thermal resistance decreases as input power increases. However, the relationship is not linear, and thermal resistance is found to asymptotically approach a minimum. It can thus be seen that power input can be increased to a point to achieve lower thermal resistance, but that a point of diminishing returns is reached.

Figure 9:
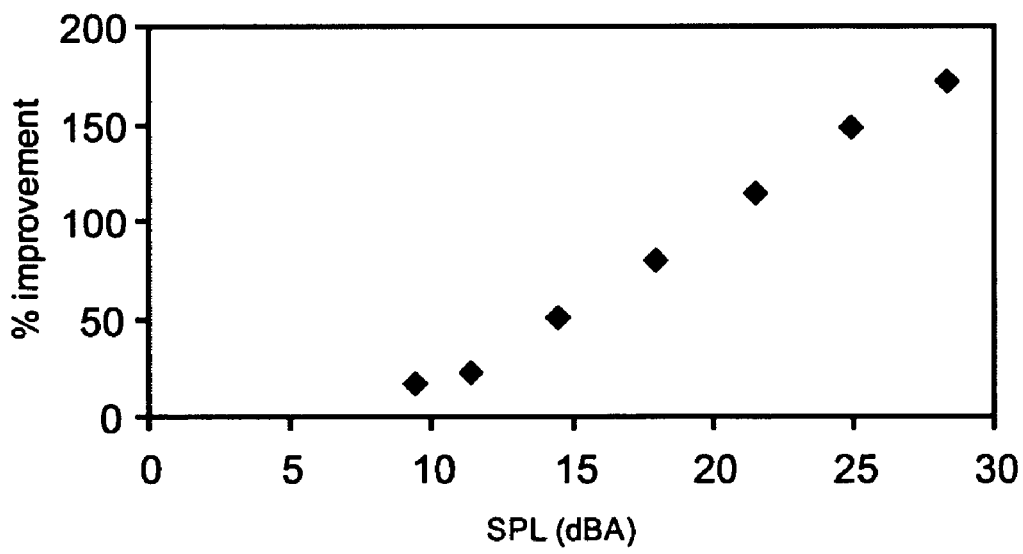
FIG. 9 is a graph of percent improvement as a function of SPL (in dBA)

FIG. 9 illustrates the percent improvement in heat dissipation as a function of sound pressure level (SPL). As seen therein, heat dissipation improves as SPL increases and, at a weighted Sound Pressure Level of 25 dBA, the improvement in heat dissipation is about 2.5×.

Figure 10:
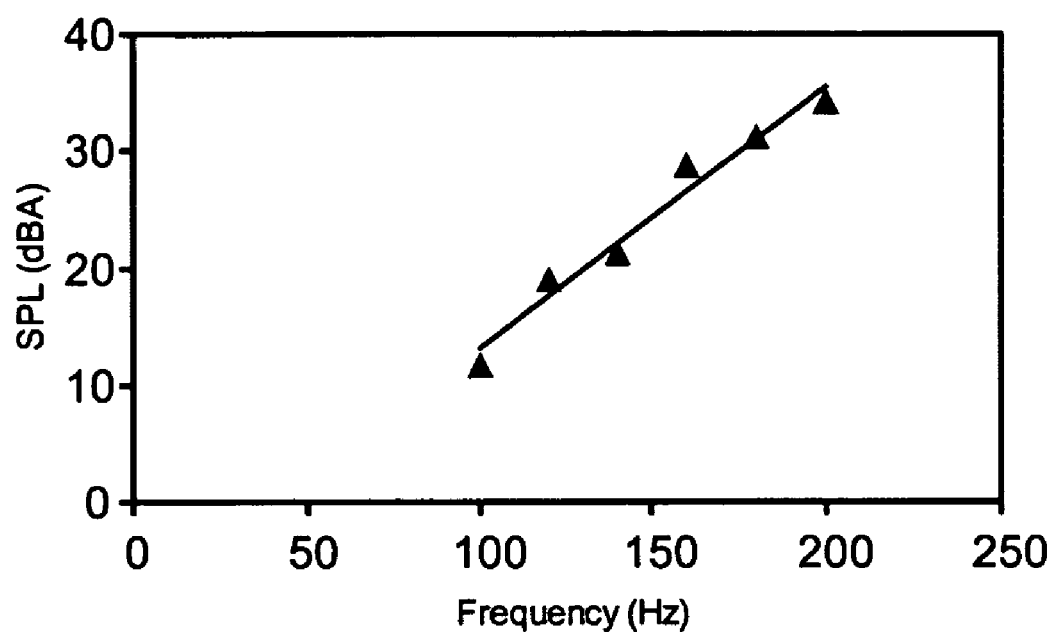
FIG. 10 is a graph of SPL (in dBA) as a function of frequency (in Hz)

FIG. 10 illustrates the relationship between SPL and frequency. As seen therein, SPL increases with actuator frequency in an essentially linear fashion. Hence, this graph demonstrates that higher frequencies result in higher acoustic noise. In this respect, operating frequencies of 150 Hz and lower are found to be optimal.

A number of variations are possible in the synthetic jet actuators utilized in the LED assemblies disclosed herein, as well as in the LED assemblies themselves. For example, while the particular LED assembly of FIGS. 3-5 utilizes a series of synthetic jets directed along the exterior of the LED housing to maintain the LED assembly within a desired operating temperature range, in other embodiments, synthetic jets may be utilized along both the interior and exterior of the housing to augment thermal management.

Figure 11:
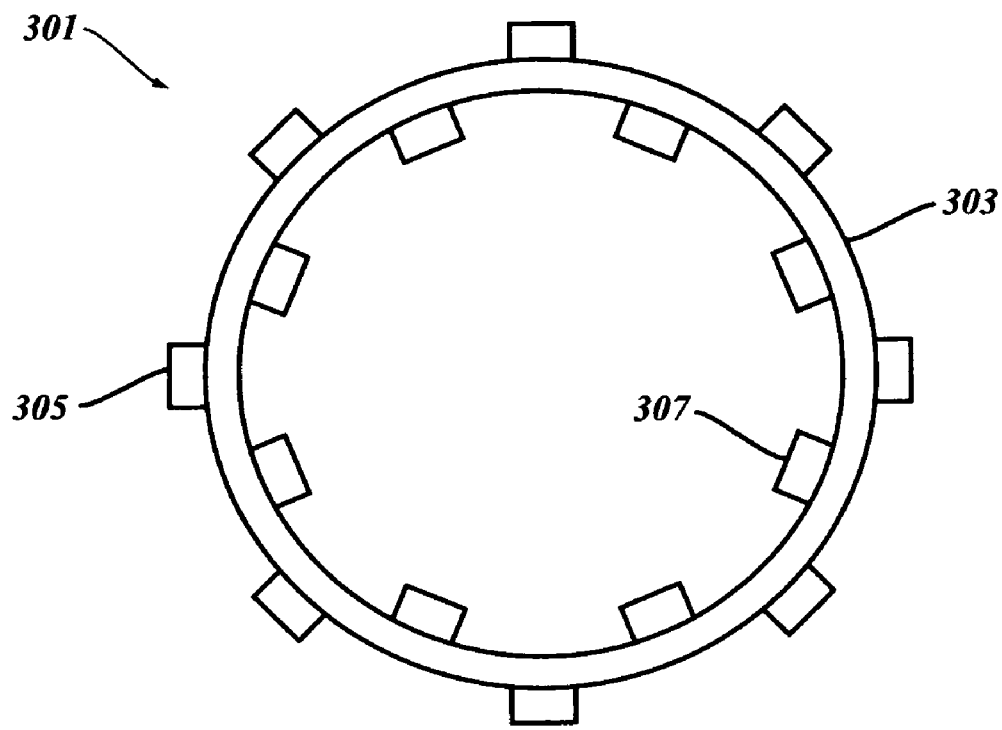
FIG. 11 is a cross-sectional illustration of an embodiment of an LED assembly made in accordance with the teachings herein.

One such embodiment is depicted in FIG. 11. In the LED assembly 301 shown therein, the assembly 301 is equipped with a housing 303, a first set 305 of synthetic jet actuators that are disposed along, and are adapted to cool, the exterior surface of the housing 303, and a second set 307 of synthetic jet actuators that are disposed along, and are adapted to cool, the interior surface of the LED housing 303. Configurations of this type may optionally be used in conjunction with first and second sets of fins which are disposed, respectively, on the exterior and interior of the LED housing 303. In such embodiments, the first 305 and second 307 sets of synthetic jet actuators will preferably be arranged so that the synthetic jets produced are directed along the longitudinal axis of the channel formed by adjacent pairs of fins. It will also be appreciated that, while the first set 305 of synthetic jet actuators are depicted as being staggered with respect to the second set 307 of synthetic jet actuators, the first 305 and second 307 sets of synthetic jet actuators may also be arranged in an opposing fashion, or may be arranged independently of each other.

In the LED assembly 301 depicted in FIG. 11, each of the individual synthetic jet actuators in the first 305 and second 307 sets of synthetic jet actuators may be combined into a single synthetic jet actuator equipped with a plurality of nozzles that are powered by a common diaphragm, in which case the first 305 and second 307 sets of synthetic jet actuators are preferably disposed at a terminal end of the LED housing. Alternatively, each of the synthetic jet actuators may each be powered by its own diaphragm, or may be arranged into groups which are powered by a common diaphragm. For example, the first set 305 of synthetic jet actuators may be powered by a first diaphragm, and the second set 307 of synthetic jet actuators may be powered by a second diaphragm. When the first 305 and second 307 sets of synthetic jet actuators are arranged in an opposing fashion, opposing pairs of the synthetic jet actuators may be powered off of the same diaphragm. In other embodiments, some or all of the synthetic jet actuators (or nozzles associated with a single synthetic jet actuator) may be adapted to direct a synthetic jet into channels formed within the walls of the LED housing.

Figure 12:
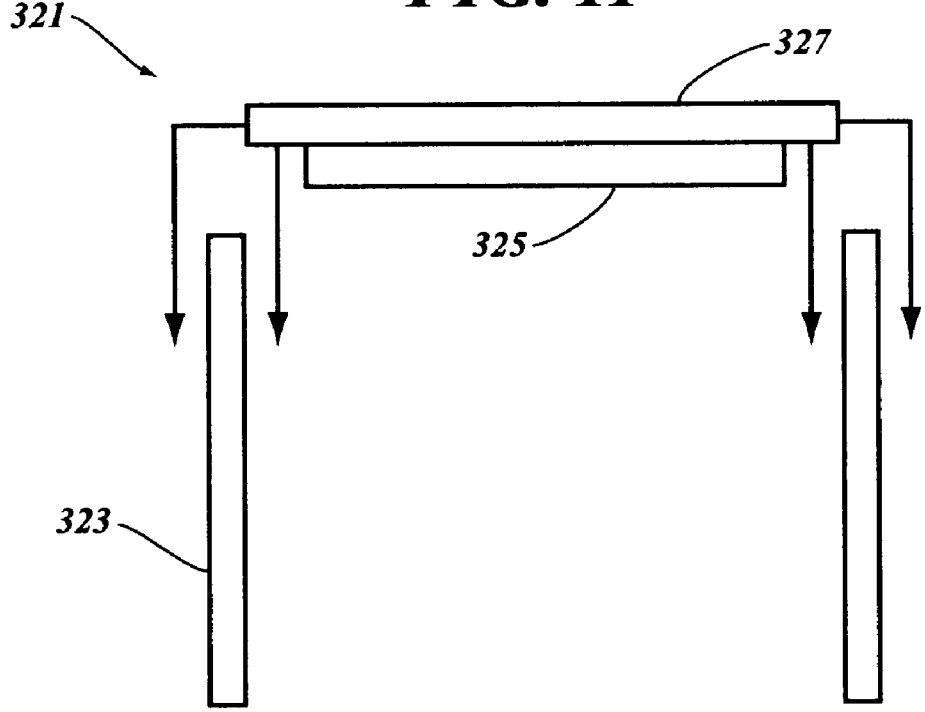
FIG. 12 is an illustration of an embodiment of an LED assembly made in accordance with the teachings herein.

FIG. 12 is a schematic diagram which illustrates an LED assembly 321 that uses an arrangement of synthetic jet actuators of the type illustrated in FIG. 11. The LED assembly 321 depicted therein comprises a housing 323, an LED circuitry package 325 (which, in this embodiment, includes both the LED itself and its associated circuitry) and a synthetic jet actuator 327. As indicated by the arrows, the actuator 327 is adapted to direct a plurality of synthetic jets along the interior and exterior surfaces of the housing 323, and between the interior surface of the housing and the LED circuitry package 325.

Figure 13:
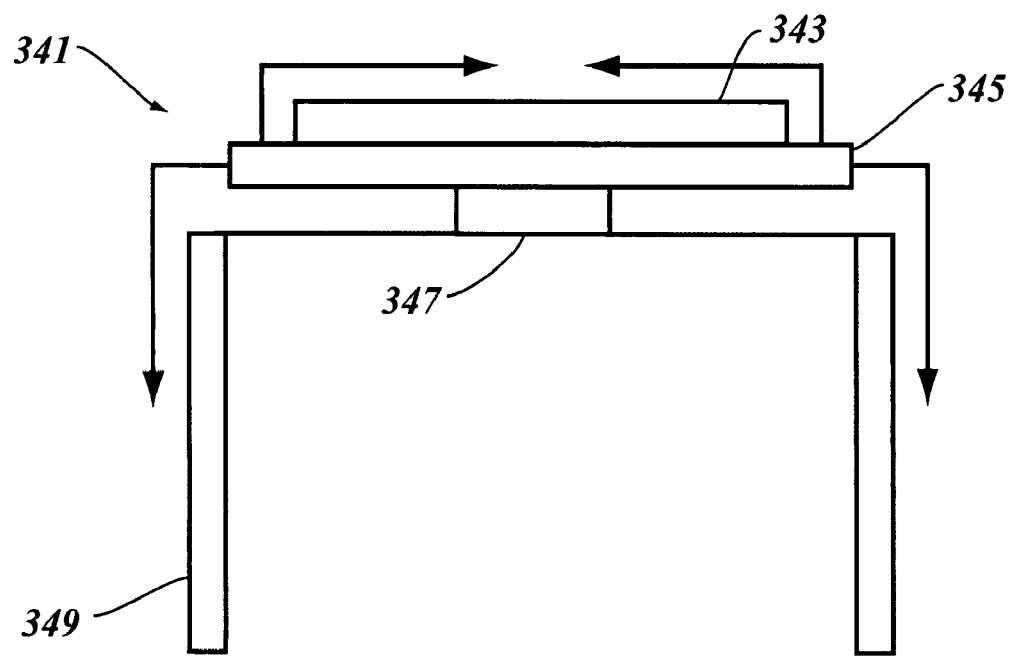
FIG. 13 is an illustration of an embodiment of an LED assembly made in accordance with the teachings herein.

FIG. 13 is a schematic diagram of a further embodiment of an LED assembly 341 made in accordance with the teachings herein. The LED assembly 341 of FIG. 13 is similar in many respects to the LED assembly depicted in FIG. 12, but differs in that the electronics package 343 is mounted on the backside of the synthetic jet actuator 345, while the LED 347 itself is mounted on the opposing surface of the synthetic jet actuator 345. The synthetic jet actuator 345 is adapted to direct a flow of fluid across the surface of both the electronics package 343 and the exterior of the housing 349. In some variations of this embodiment, the synthetic jet actuator 345 may be further adapted to direct a synthetic jet along the interior surface of the housing 349.

Figure 14:
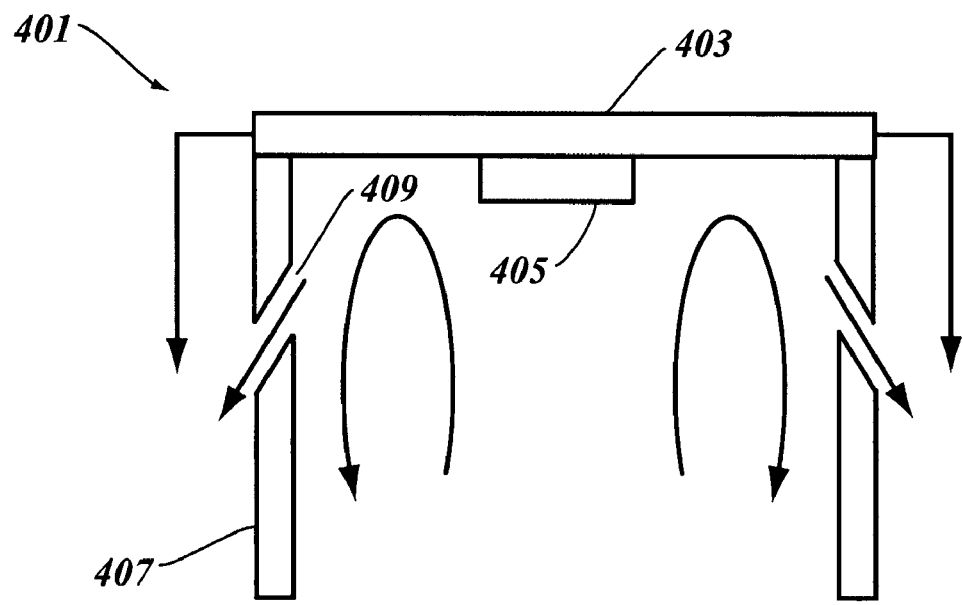
FIG. 14 is an illustration of an embodiment of an LED assembly made in accordance with the teachings herein.

FIG. 14 illustrates a further embodiment of an LED assembly made in accordance with the teachings herein. The LED assembly 401 depicted therein comprises a synthetic jet actuator 403 upon which is mounted the LED diode 405 and the associated electronics. The synthetic jet actuator 403 is mounted along its periphery to the LED housing 407 and is adapted to direct a plurality of synthetic jets along the exterior of the housing. The LED housing 407 is equipped with a plurality of apertures 409 that allow the atmosphere inside the LED housing 407 to be in communication with the external atmosphere. Preferably, these apertures 409 are aligned with the synthetic jets such that, while the synthetic jets cool the exterior of the housing 407, they also induce convection currents within the housing 407 that cool the diode 405.

A number of variations are possible in the embodiment depicted in FIG. 14. For example, in some embodiments, the synthetic jet actuator 403 may be equipped with a first set of nozzles that direct synthetic jets along the exterior surface of the LED housing 407, and a second set of nozzles that direct synthetic jets along the interior surface of the LED housing 407. Moreover, the apertures 409 may be oriented at various angles, and in some embodiments, different sets of apertures may be oriented at different angles. The angle of the aperture may also vary in accordance with certain criteria, such as the distance of the aperture from the synthetic jet actuator 403 or a nozzle thereof.

Figure 15:
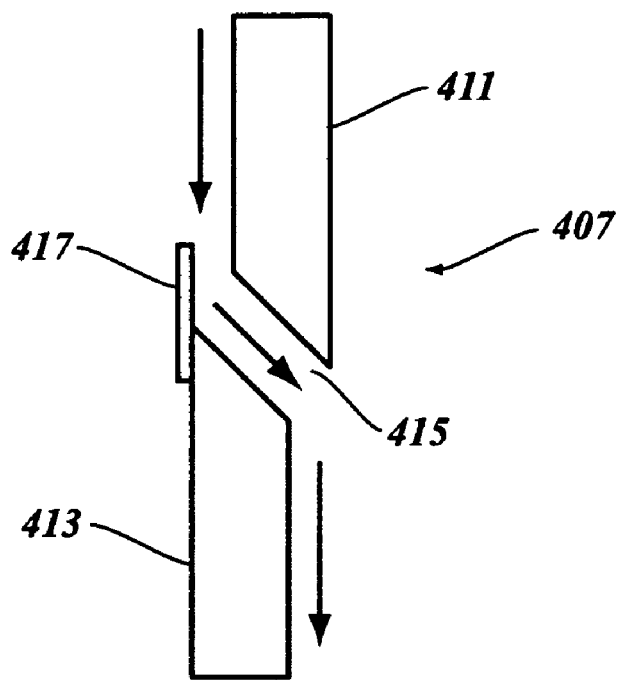
FIG. 15 is an illustration of an embodiment of an LED assembly made in accordance with the teachings herein.
Figure 16:
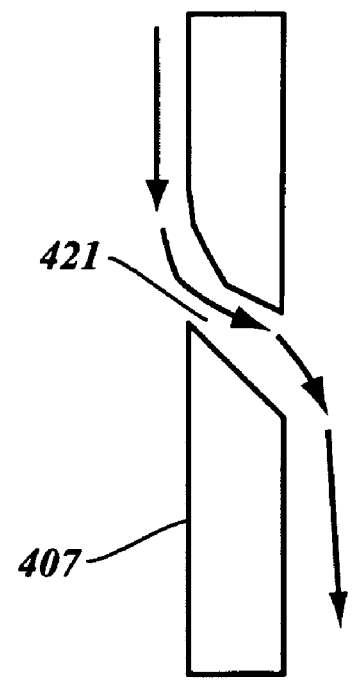
FIG. 16 is an illustration of an embodiment of an LED assembly made in accordance with the teachings herein.

FIGS. 15-16 illustrate some specific configurations of apertures that may be utilized in the device depicted in FIG. 14. In the device depicted in FIG. 15, the housing 407 contains a top portion 411 and a bottom portion 413 that are offset with respect to each other, and the aperture 415 extends at a downward angle. A plate 417 is provided on one side of the aperture which facilitates entrainment of the fluid flow into the aperture 415. In the particular embodiment depicted, the flow goes from the outside of the housing 407 to the inside of the housing, though one skilled in the art will appreciate that, in other embodiments, the fluid flow could go from the inside of the housing to the outside of the housing.

In the device depicted in FIG. 16, the aperture 421 is again angled downward. However, in this embodiment, the surface of the aperture 421 is configured as a Coanda surface. Consequently, under appropriate conditions, the fluid flow will tend to hug the surface, thus allowing the flow to be directed into the aperture 421 without the need for an offset or plate.

Figure 17:
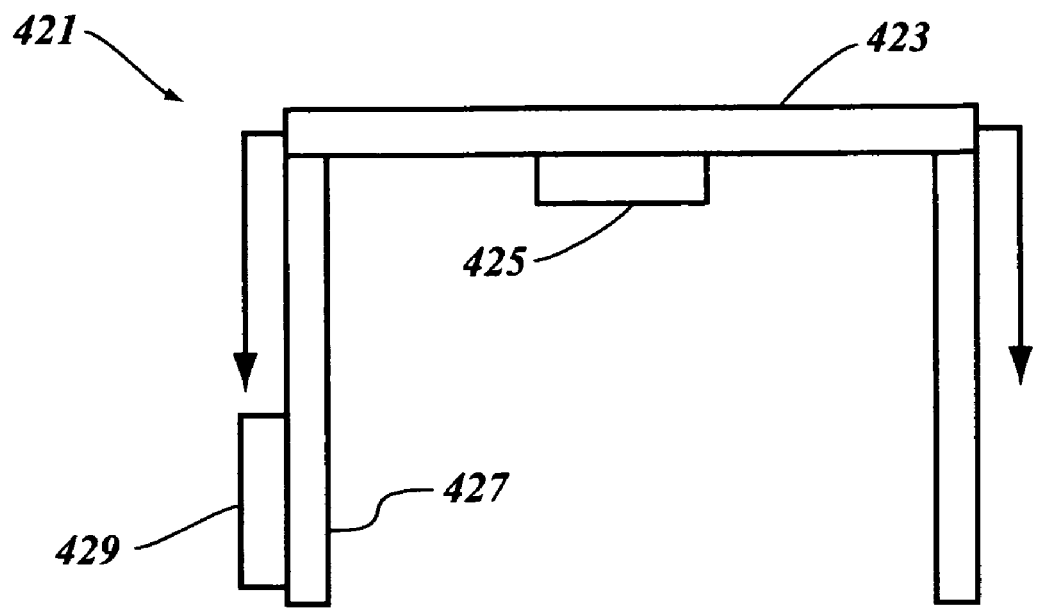
FIG. 17 is an illustration of an embodiment of an LED assembly made in accordance with the teachings herein.

FIG. 17 illustrates yet another embodiment of the LED assemblies disclosed herein. The LED assembly 421 depicted in FIG. 17 comprises a synthetic jet actuator 423 upon which is mounted the LED diode 425. The synthetic jet actuator 423 is mounted along its periphery to the LED housing 427 and is adapted to direct a plurality of synthetic jets along the exterior of the LED housing 427. In this embodiment, however, the electronics package 429 that operates the LED diode 425 is separated therefrom, and is mounted on the exterior of the LED housing 427. The synthetic jet actuator 423 is preferably adapted to direct one or more synthetic jets onto the electronics package 429 to provide thermal management for the package 429.

Figure 18:
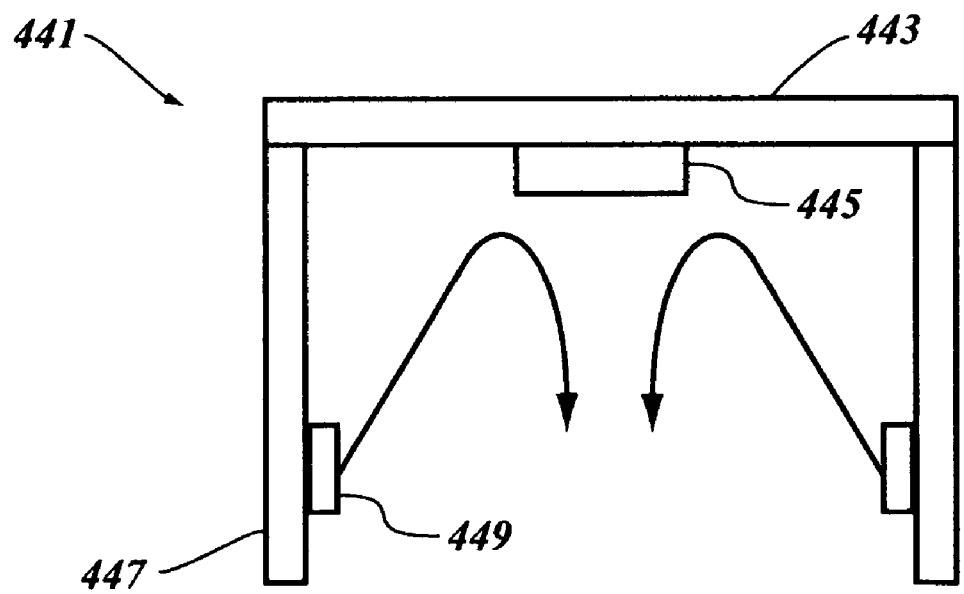
FIG. 18 is an illustration of an embodiment of an LED assembly made in accordance with the teachings herein.
Figure 19:
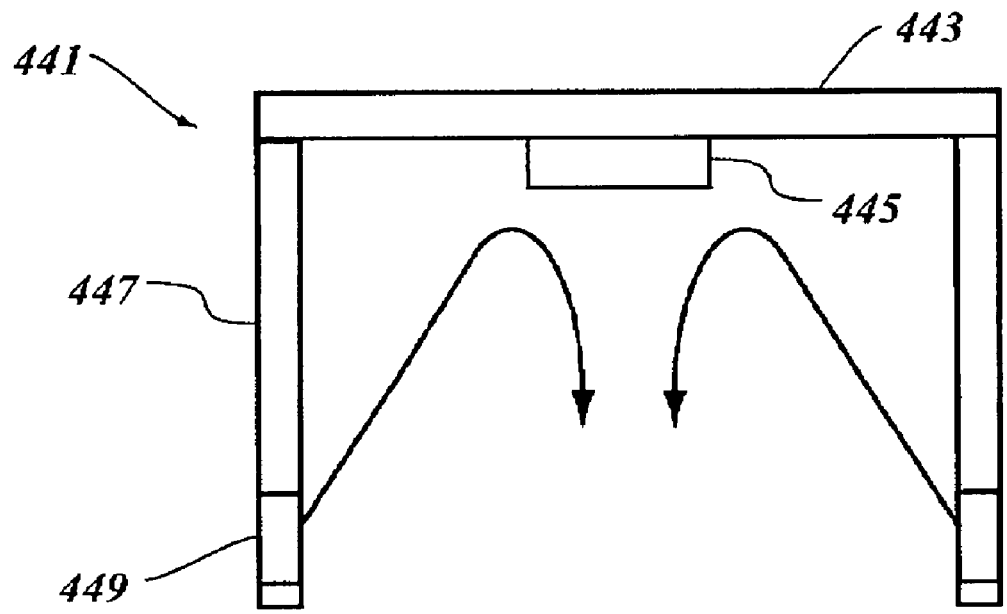
FIG. 19 is an illustration of an embodiment of an LED assembly made in accordance with the teachings herein.

FIG. 18 illustrates yet another embodiment of an LED assembly made in accordance with the teachings herein. The LED assembly 441 depicted in FIG. 16 comprises a synthetic jet actuator 443 upon which is mounted the LED diode 445. The synthetic jet actuator 443 is mounted along its periphery to the LED housing 447 and is adapted to direct a plurality of synthetic jets along the exterior of the LED housing 447. A plurality of synthetic jet actuators 449 are also mounted on the interior of the LED housing 447 and are adapted to direct a synthetic jet onto the surface of the LED diode 445. A further variation of this embodiment is shown in FIG. 17, where the plurality of synthetic jet actuators 449 are mounted within the LED housing 447.

Figure 20:
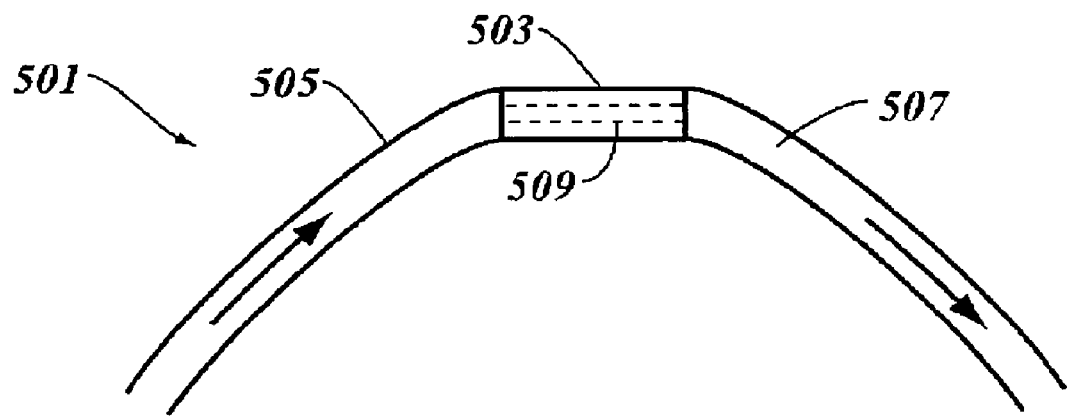
FIG. 20 is an illustration of an embodiment of an LED assembly made in accordance with the teachings herein.
Figure 21:
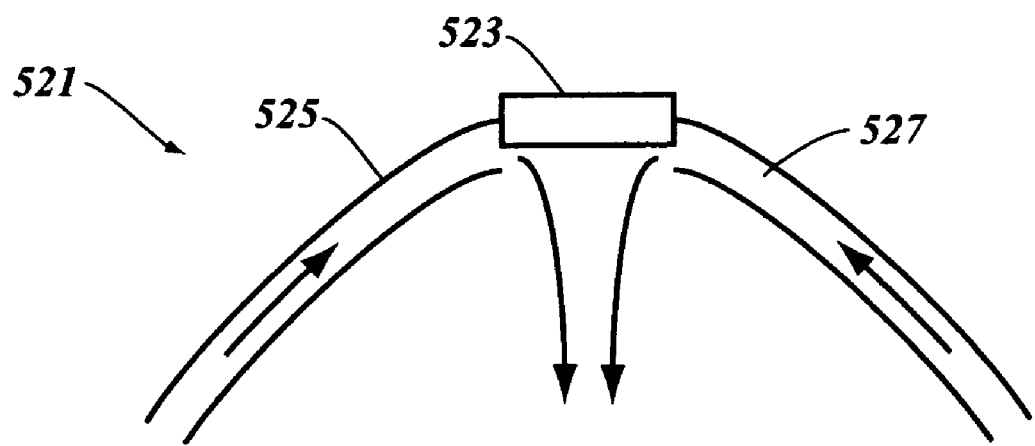
FIG. 21 is an illustration of an embodiment of an LED assembly made in accordance with the teachings herein.
Figure 22:
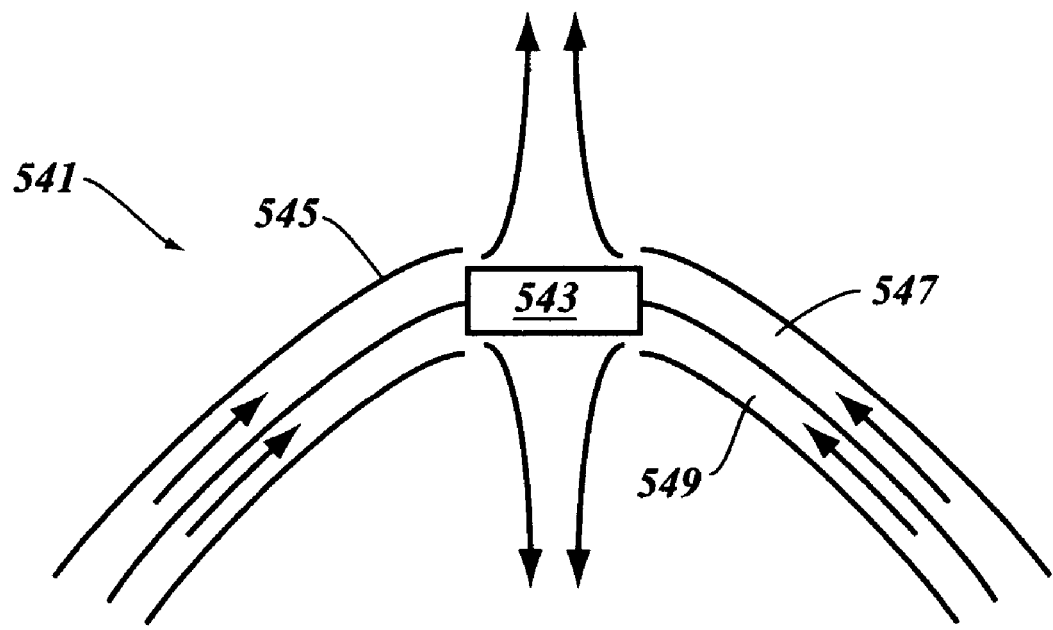
FIG. 22 is an illustration of an embodiment of an LED assembly made in accordance with the teachings herein.

FIGS. 20-22 illustrate some further possible configurations for directly cooling an LED diode that may be incorporated into the various embodiments disclosed herein. In the configuration 501 depicted in FIG. 20, an LED diode 503 is provided which is embedded in the LED housing 505. One or more passageways 507 are provided within the LED housing 505 through which a synthetic jet may be directed to cool the LED diode 503. In some embodiments, one or more channels 509 are provided in the LED diode 503 that are in open communication with the passageway 507 in the LED housing 505, thereby permitting a direct flow of fluid through the diode 503. In other embodiments, the passageways may extend around the periphery of the diode 503.

In the configuration 521 depicted in FIG. 21, a diode 523 is provided which is also embedded in the LED housing 525, and the LED housing 525 is again provided with one or more passageways 527 for the flow of a fluid therethrough. In this configuration, however, the passageways are in open communication with the interior of the LED housing 525 in the vicinity of the diode 523. Consequently, the flow of a synthetic jet through the passageways creates a flow of fluid over the active surface of the diode 523.

In the configuration 541 depicted in FIG. 22, a diode 543 is provided which is also embedded in the LED housing 545. The LED housing 545 is provided with first 547 and second 549 passageways for the flow of a fluid therethrough, with the first passageway 547 being in open communication with the exterior of the LED housing 545 in the vicinity of the diode 543, and the second passageway 549 being in open communication with the interior of the LED housing 545 in the vicinity of the diode 543. Consequently, when these passageways are connected to a synthetic jet actuator, the jet traverses the passageways and creates a flow of fluid over both surfaces of the diode 543. In variations of this embodiment, a single passageway may be provided that is in open communication with both the interior and exterior of the LED housing 545.

In some embodiments of the LED assemblies described herein, one or more additional heat sinks may also be attached to one or more surfaces of the LED module. For example, in some embodiments, an external heat sink may be attached to the bottom of the LED assembly. These heat sinks may be conventional heat sinks, or they may be heat sinks that utilize synthetic jet actuators.

It is also to be understood that, while the use of acoustical or electromagnetic synthetic jet actuators is preferred in the various embodiments disclosed herein, other types of actuators may also be used. These include, without limitation, piezoelectric actuators and reed jet actuators.

The synthetic jet actuators described herein may be equipped with various drive mechanisms. Preferably, the electronics for the drive mechanisms of the synthetic jet actuators is integrated with the electronics for the LED assembly.

In some embodiments, the LED cavity may be utilized as all or part of the cavity of an acoustic resonator, such as a Helmholtz resonator or pipe resonator. Such embodiments may, in some applications, provide especially high energy efficiencies. Resonators of this type are described ion commonly assigned application Ser. No. 11/248,542 by Beltran et al., entitled "Acoustic Resonator for Synthetic Jet Generation for Thermal Management", and filed on Oct. 13, 2005, which is incorporated by reference in its entirety.

Figure 23:
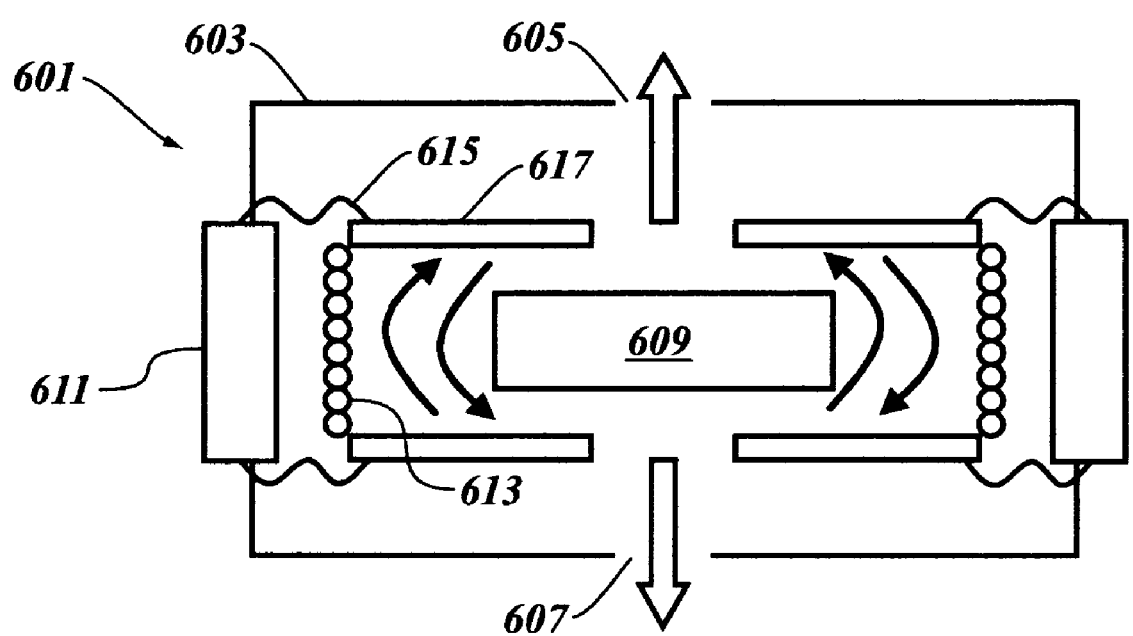
FIG. 23 is an illustration of an embodiment of an LED assembly made in accordance with the teachings herein.

LED assemblies may also be made in accordance with the teachings herein which serve as multi-directional light sources. One example is the dual-sided LED assembly 601 shown in FIG. 23. The assembly 601 depicted therein includes a housing 603 equipped with first 605 and second 607 opposing apertures, and an LED 609 which is disposed in the central cavity of the housing 603. The housing 603 is further equipped on each terminal portion with an annular magnet 611, a coil 613, a surround 615, and an annular diaphragm 617. In use, the LED 609 emits light through the central cavity of the housing 603, while synthetic jets are produced from either a central orifice or peripheral orifices through vibration of the diaphragm 617, resulting in a rapid mixing and ejection of flow from within the central cavity as indicated by the arrows.

Figure 24:
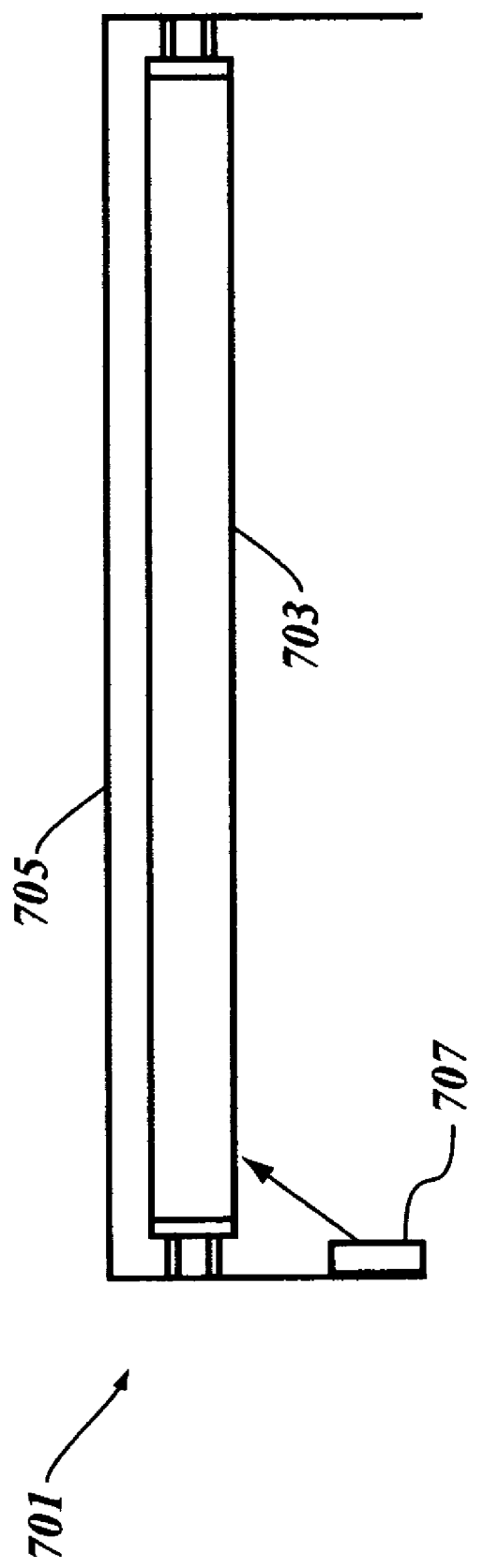
FIG. 24 is an illustration of an embodiment of a fluorescent lighting fixture made in accordance with the teachings herein.

Much of the present disclosure has dealt with the use of synthetic jet actuators in cooling LED assemblies. However, one skilled in the art will appreciate that the devices and methodologies disclosed herein may be applied to various other thermal management applications, especially within the lighting arts. One such embodiment is depicted in FIG. 24, which illustrates a fluorescent light fixture 701. The fixture 701 comprises a fluorescent bulb 703 which is mounted within a housing 705. A synthetic jet actuator 707 is mounted on an interior wall of the housing 705 and is adapted to direct a synthetic jet at the hotspot generated along the length of the bulb 703. It has been found that, by thermally managing the hotspot, the life of the fluorescent bulb is significantly increased.

In the various embodiments of the devices and methodologies described herein, the fluid utilized by the synthetic jet actuator to provide thermal management is preferably air. One skilled in the art will appreciate, however, that in many embodiments, other gases or liquids may be utilized as the fluid. For example, in some embodiments, especially where the thermal management system is a closed loop system, the use of inert gasses such as nitrogen, argon, helium, or fluorocarbons may be advantageous. In other applications, ambient air may be utilized as the fluid medium, but filters or scrubbers may be provided to remove certain components of the air. For example, the LED assembly may be equipped with a desiccant to control the moisture content of air entering the assembly. In still other embodiments, liquids may be employed as the fluid medium. Such liquids include, but are not limited to, water and various organic liquids, such as, for example, polyethylene glycol, polypropylene glycol, and other polyols, partially fluorinated or perfluorinated ethers, and various dielectric materials. Liquid metals (which are generally metal alloys with an amorphous atomic structure) may also be advantageously used in some embodiments of the devices and methodologies described herein.

The use of synthetic jet actuators in the systems described herein has a number of advantages beyond the enhanced performance that these devices impart to thermal management systems. For example, the actuators may be energized at an audible frequency or sweep of frequencies in response to detection of a certain operating or environmental state. Thus, for example, the synthetic jet actuators may be configured to operate as a siren or alarm in order to alert the user of an illumination device to a performance change (e.g., that it is time to replace the LED or that a color component is malfunctioning) or an emergency state (e.g., the detection of smoke or an intruder). A similar approach could be used to create illumination devices that serve various other functionalities, such as alarm clock functions. Typically, these additional functionalities will require little or no additional hardware, although some added functionality to the actuator driver may be required.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. An LED assembly, comprising:
   a housing;
   an LED disposed in said housing; and
   a synthetic jet actuator which releasable attaches to one end of said housing and which is adapted to create a flow of fluid across a surface of said LED such that the flow of fluid is in contact with the surface of said LED.

2. The LED assembly of claim 1, wherein said synthetic jet actuator is further adapted to direct a synthetic jet along a surface of said housing.

3. The LED assembly of claim 2, wherein said synthetic jet actuator is adapted to direct a synthetic jet along both an interior surface and an exterior surface of said housing.

4. The LED assembly of claim 2, wherein a portion of said housing is equipped with first and second fins, wherein said first and second fins define a channel, and wherein said synthetic jet is directed along the longitudinal axis of said channel.

5. The LED assembly of claim 4, wherein said first and second fins are oriented essentially parallel to the longitudinal axis of said housing.

6. The LED assembly of claim 4, wherein said first and second fins are disposed on an exterior surface of said housing.

7. The LED assembly of claim 4, wherein said first and second fins are disposed on an interior surface of said housing.

8. The LED assembly of claim 1, wherein said synthetic jet actuator is further adapted to direct a synthetic jet along a channel formed within a wall of said housing.

9. The LED assembly of claim 1, wherein said synthetic jet actuator is adapted to direct a synthetic through a channel formed in said LED.

10. The LED assembly of claim 1, wherein said housing is annular.

11. The LED assembly of claim 10, wherein said housing is further equipped with at least one tab that rotatably engages an aperture provided in said actuator.

12. The LED assembly of claim 1, wherein said LED assembly is equipped with a first set of synthetic jet actuators which are disposed along an interior surface of said housing, and a second set of synthetic jet actuators which are disposed along an exterior surface of said housing.

13. The LED assembly of claim 1, wherein said synthetic jet actuator is disposed at a terminal portion of said LED housing and has first and second major opposing surfaces, wherein said LED is disposed on said first major surface, and wherein said LED assembly further comprises an electronics package that is disposed on said second major surface.

14. The LED assembly of claim 13, wherein said synthetic jet actuator is adapted to direct a synthetic jet along a surface of said housing and along a surface of said electronics package.

15. The LED assembly of claim 1, wherein said housing is equipped with an aperture, and wherein said synthetic jet actuator is adapted to direct a synthetic jet across the opening of said aperture.

16. The LED assembly of claim 15, wherein said aperture is slanted away from the direction of the synthetic jet which is directed across the opening of said aperture.

17. The LED assembly of claim 1, wherein said LED assembly further comprises an electronics package that is disposed on an exterior surface of said housing, and wherein said synthetic jet actuator is adapted to direct a synthetic jet toward said electronics package.

18. The LED assembly of claim 1, wherein said surface of said LED is a light emitting surface.

19. The LED assembly of claim 1, wherein said synthetic jet actuator is further adapted to direct a synthetic jet along a channel formed within a wall of said housing.

20. The LED assembly of claim 1, wherein said synthetic jet actuator is adapted to direct a synthetic jet across a surface of said LED.

21. An LED assembly, comprising:
   a housing;
   an LED disposed in said housing; and
   a synthetic jet actuator adapted to create a flow of fluid across a surface of said LED such that the flow of fluid is in contact with the surface of said LED;
wherein said synthetic jet actuator is further adapted to direct a synthetic jet along a surface of said housing, wherein a portion of said housing is equipped with first and second fins, wherein said first and second fins define a channel, and wherein said synthetic jet is directed along the longitudinal axis of said channel.

22. The LED assembly of claim 21, wherein said synthetic jet actuator is adapted to direct a synthetic jet along both an interior surface and an exterior surface of said housing.

23. The LED assembly of claim 21, wherein said synthetic jet actuator is further adapted to direct a synthetic jet along a channel formed within a wall of said housing.

24. The LED assembly of claim 21, wherein said synthetic jet actuator is further adapted to direct a synthetic through a channel formed in said LED.

25. The LED assembly of claim 21, wherein said first and second fins are oriented essentially parallel to the longitudinal axis of said housing.

26. The LED assembly of claim 21, wherein said first and second fins are disposed on an exterior surface of said housing.

27. The LED assembly of claim 21, wherein said first and second fins are disposed on an interior surface of said housing.

28. The LED assembly of claim 21, wherein said housing is annular.

29. The LED assembly of claim 28, wherein said housing is further equipped with at least one tab that rotatably engages an aperture provided in said actuator.

30. The LED assembly of claim 21, wherein said LED assembly is equipped with a first set of synthetic jet actuators which are disposed along an interior surface of said housing, and a second set of synthetic jet actuators which are disposed along an exterior surface of said housing.

31. The LED assembly of claim 21, wherein said synthetic jet actuator is disposed at a terminal portion of said LED housing and has first and second major opposing surfaces, wherein said LED is disposed on said first major surface, and wherein said LED assembly further comprises an electronics package that is disposed on said second major surface.

32. The LED assembly of claim 21, wherein said synthetic jet actuator is adapted to direct a synthetic jet along a surface of said housing and along a surface of said electronics package.

33. The LED assembly of claim 21, wherein said housing is equipped with an aperture, and wherein said synthetic jet actuator is adapted to direct a synthetic jet across the opening of said aperture.

34. The LED assembly of claim 33, wherein said aperture is slanted away from the direction of the synthetic jet which is directed across the opening of said aperture.

35. The LED assembly of claim 21, wherein said LED assembly further comprises an electronics package that is disposed on an exterior surface of said housing, and wherein said synthetic jet actuator is adapted to direct a synthetic jet toward said electronics package.

36. The LED assembly of claim 21, wherein said surface of said LED is a light emitting surface.

37. The LED assembly of claim 21, wherein said synthetic jet actuator is further adapted to direct a synthetic jet along a channel formed within a wall of said housing.

38. The LED assembly of claim 21, wherein said synthetic jet actuator is adapted to direct a synthetic jet across a surface of said LED.

39. An LED assembly, comprising:
a housing;
an LED disposed in said housing; and
a synthetic jet actuator adapted to create a flow of fluid across a surface of said LED such that the flow of fluid is in contact with the surface of said LED;
wherein said synthetic jet actuator is adapted to direct a synthetic through a channel formed in said LED.

40. The LED assembly of claim 39, wherein said synthetic jet actuator is further adapted to direct a synthetic jet along a surface of said housing.

41. The LED assembly of claim 40, wherein a portion of said housing is equipped with first and second fins, wherein said first and second fins define a channel, and wherein said synthetic jet is directed along the longitudinal axis of said channel.

42. The LED assembly of claim 39, wherein said synthetic jet actuator is adapted to direct a synthetic jet along both an interior surface and an exterior surface of said housing.

43. The LED assembly of claim 39, wherein said synthetic jet actuator is further adapted to direct a synthetic jet along a channel formed within a wall of said housing.

44. The LED assembly of claim 39, wherein said synthetic jet actuator is adapted to direct a synthetic through a channel formed in said LED.

45. The LED assembly of claim 39, wherein said first and second fins are oriented essentially parallel to the longitudinal axis of said housing.

46. The LED assembly of claim 45, wherein said first and second fins are disposed on an exterior surface of said housing.

47. The LED assembly of claim 45, wherein said first and second fins are disposed on an interior surface of said housing.

48. The LED assembly of claim 39, wherein said housing is annular.

49. The LED assembly of claim 47, wherein said housing is further equipped with at least one tab that rotatably engages an aperture provided in said actuator.

50. The LED assembly of claim 39, wherein said LED assembly is equipped with a first set of synthetic jet actuators which are disposed along an interior surface of said housing, and a second set of synthetic jet actuators which are disposed along an exterior surface of said housing.

51. The LED assembly of claim 39, wherein said synthetic jet actuator is disposed at a terminal portion of said LED housing and has first and second major opposing surfaces, wherein said LED is disposed on said first major surface, and wherein said LED assembly further comprises an electronics package that is disposed on said second major surface.

52. The LED assembly of claim 51, wherein said synthetic jet actuator is adapted to direct a synthetic jet along a surface of said housing and along a surface of said electronics package.

53. The LED assembly of claim 39, wherein said housing is equipped with an aperture, and wherein said synthetic jet actuator is adapted to direct a synthetic jet across the opening of said aperture.

54. The LED assembly of claim 52, wherein said aperture is slanted away from the direction of the synthetic jet which is directed across the opening of said aperture.

55. The LED assembly of claim 39, wherein said LED assembly further comprises an electronics package that is disposed on an exterior surface of said housing, and wherein said synthetic jet actuator is adapted to direct a synthetic jet toward said electronics package.

56. The LED assembly of claim 39, wherein said surface of said LED is a light emitting surface.

57. The LED assembly of claim 39, wherein said synthetic jet actuator is further adapted to direct a synthetic jet along a channel formed within a wall of said housing.

58. The LED assembly of claim 39, wherein said synthetic jet actuator is adapted to direct a synthetic jet across a surface of said LED.

* * * * *